US011224146B2

(12) United States Patent
Langenfeld

(10) Patent No.: US 11,224,146 B2
(45) Date of Patent: Jan. 11, 2022

(54) APPARATUS FOR ELECTRONIC COOLING ON AN AUTONOMOUS DEVICE

(71) Applicant: DEKA Products Limited Partnership, Manchester, NH (US)

(72) Inventor: Christopher C. Langenfeld, Nashua, NH (US)

(73) Assignee: DEKA Products Limited Partnership, Manchester, NH (US)

( * ) Notice: Subject to any disclaimer, the term of this patent is extended or adjusted under 35 U.S.C. 154(b) by 0 days.

(21) Appl. No.: 16/883,668

(22) Filed: May 26, 2020

(65) Prior Publication Data

US 2021/0112687 A1  Apr. 15, 2021

Related U.S. Application Data

(60) Provisional application No. 62/852,652, filed on May 24, 2019.

(51) Int. Cl.
*H05K 7/20* (2006.01)
*H01L 23/473* (2006.01)

(52) U.S. Cl.
CPC ..... *H05K 7/20872* (2013.01); *H05K 7/20254* (2013.01); *H05K 7/20272* (2013.01); *H05K 7/20863* (2013.01); *H01L 23/473* (2013.01)

(58) Field of Classification Search
CPC .......... H05K 7/20218; H05K 7/20254; H05K 7/20872; H05K 7/20927; H05K 1/0203; H01L 23/473
See application file for complete search history.

(56) References Cited

U.S. PATENT DOCUMENTS

| | | | | |
|---|---|---|---|---|
| 5,915,463 | A * | 6/1999 | Romero | H01L 23/473 165/80.3 |
| 6,729,383 | B1 * | 5/2004 | Cannell | F28F 3/022 165/185 |
| 7,197,819 | B1 * | 4/2007 | Rinehart | H01L 23/473 228/180.1 |
| 9,301,421 | B2 * | 3/2016 | French, Jr. | H05K 7/20727 |
| 9,888,617 | B2 * | 2/2018 | Ishiyama | H01L 23/4012 |
| 10,455,734 | B2 * | 10/2019 | Tochiyama | H01L 23/473 |
| 2007/0227697 | A1 * | 10/2007 | Takahashi | H01L 23/473 165/80.4 |
| 2016/0290728 | A1 * | 10/2016 | Coteus | H01L 23/473 |

* cited by examiner

*Primary Examiner* — Zachary Pape
(74) *Attorney, Agent, or Firm* — Michael George Norris

(57) ABSTRACT

An apparatus to cool electronics in an autonomous vehicle, where the autonomous vehicle includes significant computing power to receive data from on-board sensor, cellular data and user interactions and to navigate an environment to a predetermined location. The cooling system includes a radiator, fan, pump and cold plate. The cold plate is formed from two plates with extended surfaces that are mated together so that the cavities around the extended surfaces form a flow passage. The electronics processing the data and navigating are mounted on the outside surface of the cold plate.

22 Claims, 8 Drawing Sheets

APPARATUS FOR ELECTRONIC COOLING ON AN AUTONOMOUS DEVICE

CROSS REFERENCE TO RELATED APPLICATIONS

This application claim priority from the following U.S. Provisional Patent Application 62/852,652 filed May 24, 2019 and is hereby incorporated by reference in its entirety.

BACKGROUND

The present teachings relate generally to autonomous mobility devices, and more specifically to cooling electrical components and sensors. Autonomous vehicles have significant computing requirements for a number of tasks that may include one or more of the following: receiving cellular data, avoiding obstacles, navigating outdoor and/or indoor environments, interacting with humans etc. The autonomous vehicle may receive data over a cellular network, from sensors located on the vehicle and from user interactions. The computing requirements to process the received data and navigate to a desired location are substantial and require one or more processors. The processors may be high powered and require active liquid cooling. Processors that are not sufficiently cooled may have operate more slowly or may fail. The cooling hardware can improve the performance and speed of the autonomous vehicle by allowing higher speed processing of data. However, the cooling hardware occupies volume and adds mass to the vehicle that detracts from payload capacity in volume and/or weight. In addition, electrical power directed to the liquid pump and radiator fan reduces energy available for range and thus reduces the AV performance. Therefore there is a need for a compact and lightweight electronics cooling system that has a low pressure drop.

SUMMARY

An apparatus for cooling the electronics in an autonomous vehicle. The apparatus includes a heat exchanger, a fan, a pump and a cold plate. The heat exchanger has first liquid passage with extended fins. The fan forces a portion of the ambient air past the extended fins. The cold plate comprising a first plate and second plate that are mated together to form a second liquid passage. The first plate has an outside face that is configured to receive a first electronic package and an inner face with extended surfaces. The second plate has an outside face configured to receive a second electronic package and an inner face with extended surfaces. The second plate has two fluid ports, at least one port is fluidically connected to the heat exchanger. The pump forces liquid through the first and second liquid passages.

BRIEF DESCRIPTION OF THE DRAWINGS

The present teachings will be more readily understood by reference to the following description, taken with the accompanying drawings, in which.

DETAILED DESCRIPTION

Figure 1A:
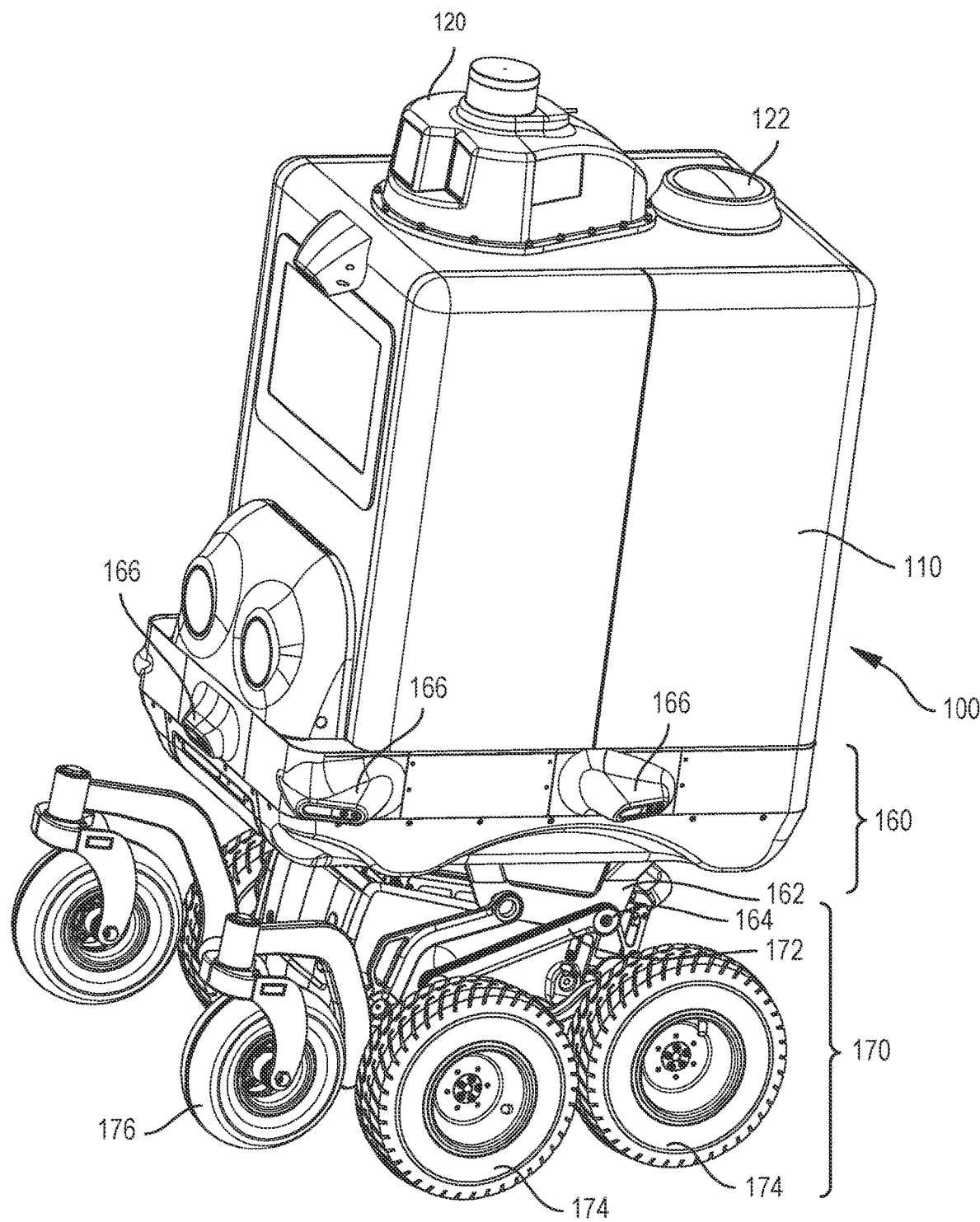
FIG. 1A is an isometric view of an autonomous vehicle

The autonomous vehicle 100 in FIG. 1A may deliver cargo and/or perform other functions involving autonomously navigating to a desired location. In some applications, the AV of FIG. 1A may be remotely guided. The AV 100 is comprises a cargo container 110 that can be opened to allow users to place or remove packages and other items. The cargo container 110 is carried by cargo platform 160 that provides mounting points for the cargo container 110 and is connected to the power base 170 via U-frame 160. The power base 170 includes the 4 powered wheels 174 and the caster wheels 176. The power base provides the speed and direction control to move the cargo container 110 along the ground and over obstacles including curbs and other discontinuous surface features.

The AV 100 includes one or more processors to receive data, navigate a path and select the direction and velocity of the power base 170. The processors receive data from the long range sensors 120 mounted on top of the cargo container 110 and from the short-range sensors 166 located in the cargo platform 160. The processors may also receive data from antennas 122 including cellular data and/or GPS data. The processors may be located anywhere in the autonomous vehicle AV 100. In some examples a processor is located with the long range sensor 120 housing and more processors may be located in the cargo platform 160. In other examples the processors may be located in the cargo container 110 or as part of the power base 170.

Figure 1B:
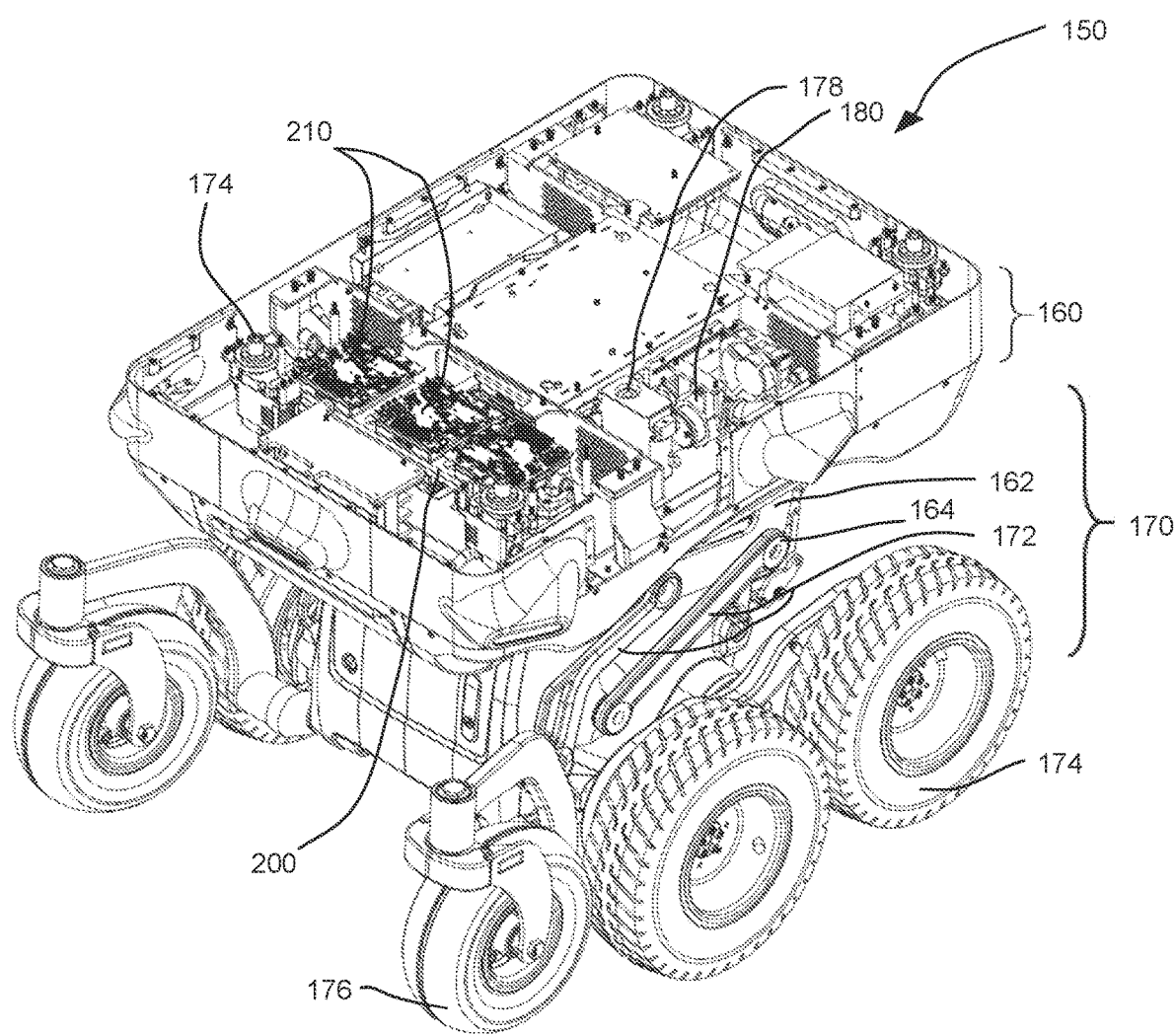
FIG. 1B is an isometric view of the cargo platform and power base of the autonomous vehicle.

FIG. 1B shows the cargo platform 160 and the power base 170 without cargo container 110 and cover. A plurality of processors 210 are shown in the un-covered cargo platform 160. The processors 210 are mounted to a single cold plate 200. In this example, other elements of the electronics cooling system including the reservoir 178 and the pump 180 are located in the cargo platform 160. The door drive motors 174 are also located in the cargo platform 160. The door drive motors 160 control the position of doors in the cargo container 110.

The cargo platform 160 is connected to the power base 170 through two U-frames 162. Each U-frame 172 is rigidly attached to the structure of the cargo platform 160 and includes two holes that allow a rotatable joint 164 to be formed with the end of each arm 172 on the power base 170. The power base controls the rotational position of the arms and thus controls the height and attitude of the cargo container 110.

Figure 3:
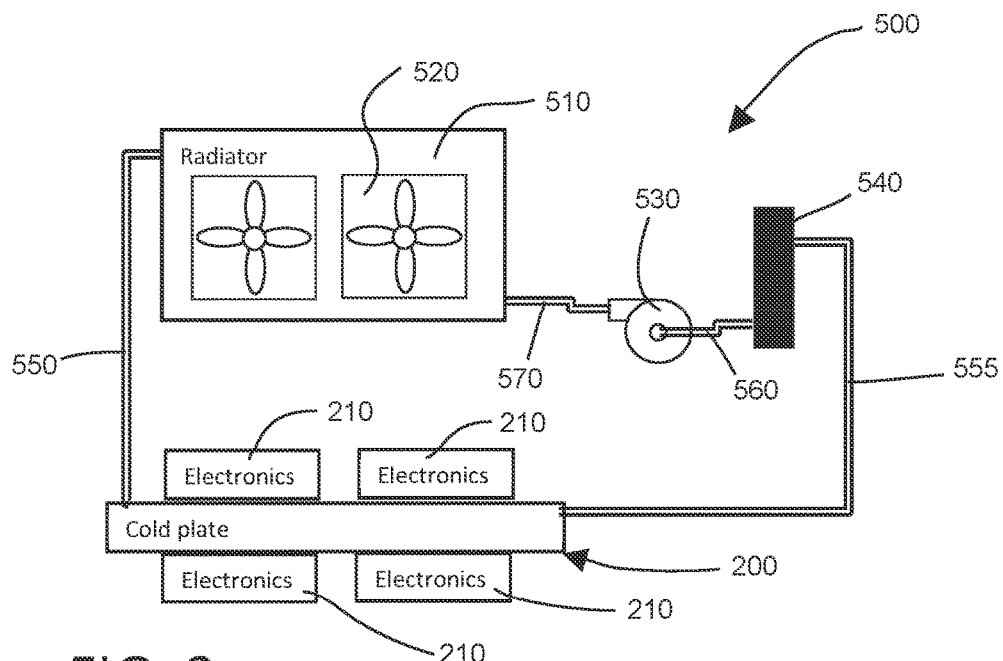
FIG. 3 is a schematic representation of the electronics cooling system.

Referring now to FIG. 3, the cooling system includes a plurality of elements to cool the electronics 210. The elements of the cooling system 500 transfer thermal energy from the electronics 210 to ambient air that is forced pass the radiator 510. Liquid coolant moves thermal energy from the cold plate 210 to the radiator 510 by flowing through the cooling system loop comprising the cold plate 200, fluid lines 555 and radiator 510. Coolant is forced through the cooling system loop by pump 530. The liquid coolant is cooled in the radiator as ambient air is forced by the fans 520 pass the radiator 510. The radiator 510 comprises liquid passages that are attached to fins or other extended surfaces. The cooling system may include a reservoir 540 that serves one or more of the following functions: allowing the liquid coolant to expand, providing a fill/drain port and allowing gas to separate from the liquid.

Figure 2A:
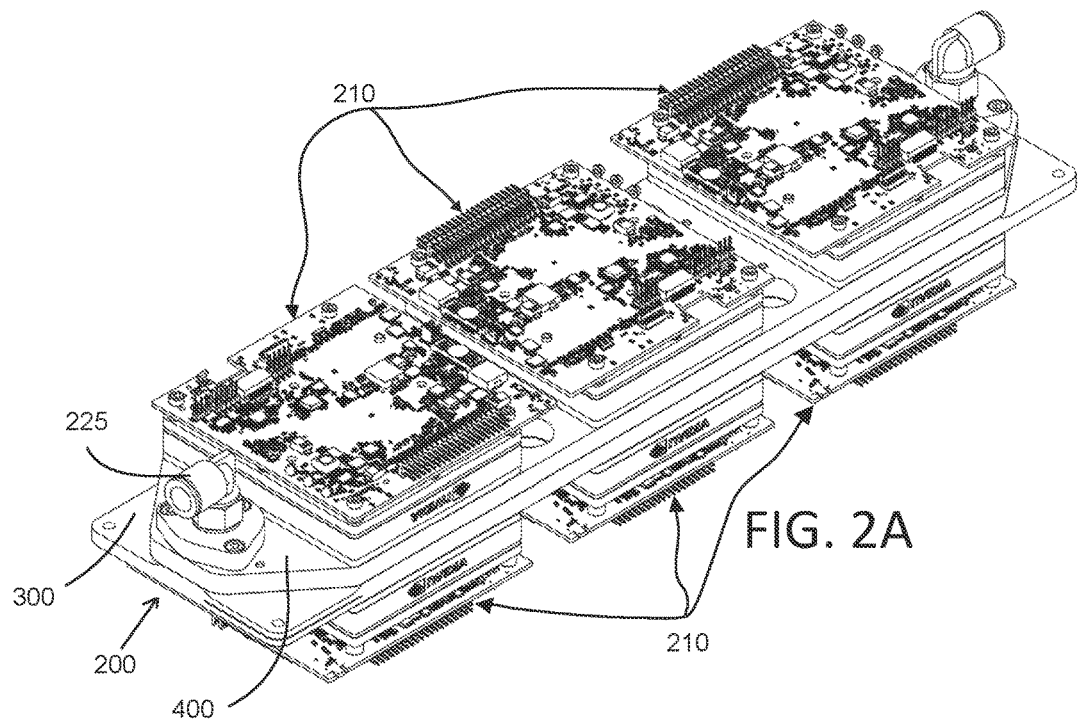
FIG. 2A is an isometric view of a plurality of processors mounted on both sides of the cold plate.

Referring now to FIG. 2A, a plurality of processors 210 are mounted to both sides of the cold plate 200. In one example the processors are Jetson AGX Xaviers from NVIDA that each dissipate 10 to 30 watts each. The Jetson AGX Xaviers have a defined face to be cooled. In this example, that cooling face is mounted flush to the outer-face of the cold plate. In one example as shown in FIG. 2A, three processors 210 are mounted to each face of the cold plate 200. The processors on one face of the cold plate 200 are approximately aligned with processors 210 on the opposite face of the cold plate.

The cold plate assembly 200 comprises a cold plate cover 300, a cold plate base 400, an inlet port 220 and an outlet port 225. The base 400 and the cover 300 are attached to each other. In one example, the inlet port 220 and the outlet port 225 are attached the base 400. In other examples, the two ports may be attached to the cover 300, or one port may be attached each of the cover 300 and the base 400.

Figure 2B:
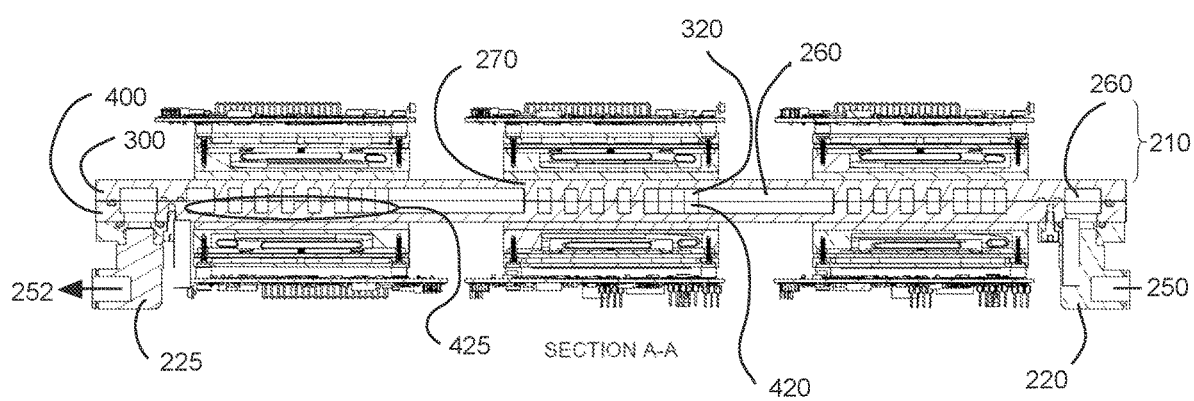
FIG. 2B is a cross-section view of the plurality of processors mounted on the cold plate.

Referring now to FIG. 2B, the cross-sectional view of the cold plate 200 shows the liquid passage 260 created between the cold plate base 400 and the cold plate cover 300. The electronic modules 210 on mounted in pairs on opposite sides of the cold plate. Heat transfer extended surfaces 320, 420 are limited to portions of the cold plate approximately under the electronic modules 210. The array of extended surfaces or pin fins 425 are aligned with the processors 210. The electronic modules may be mounted to the base 400 and the cover 300 with a thermal grease or thermal pad at the interface 270. Mounting electronic packages on both side of the cold plate minimizes the mass and volume of the cold plate, thereby providing more volume and weight for cargo.

Figure 4A:
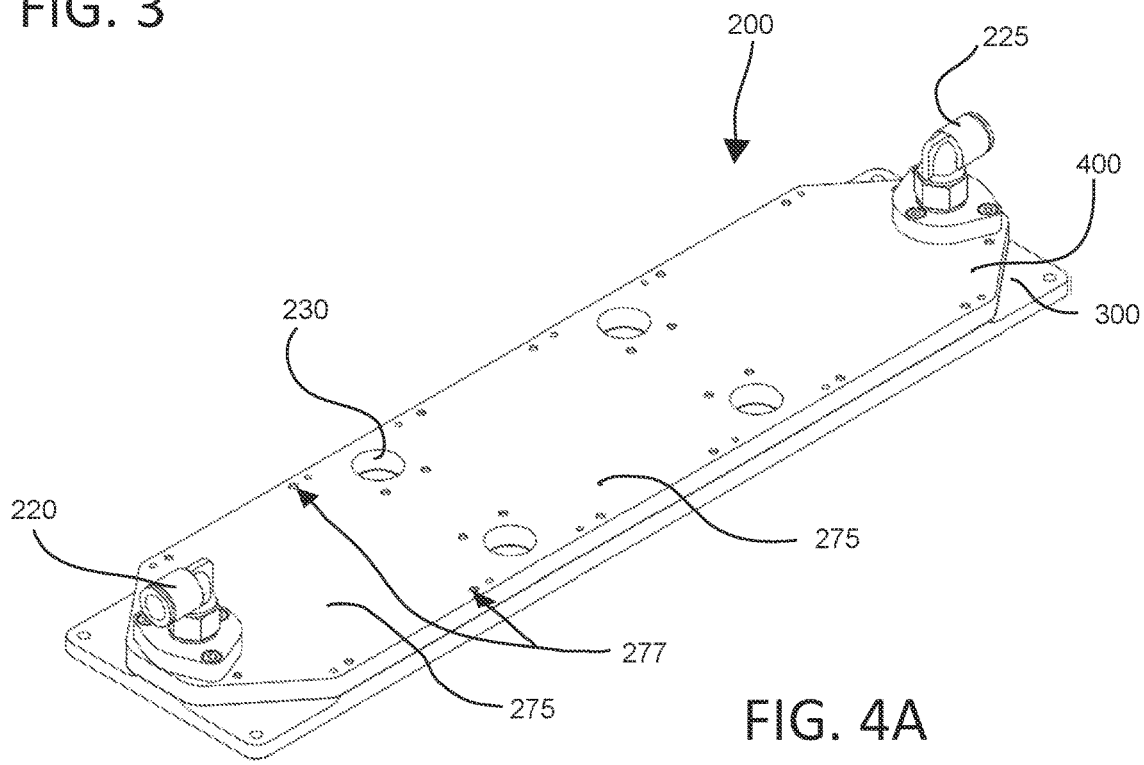
FIG. 4A is an isometric view of the cold plate.

Referring now to FIG. 4A, the electronics modules 210 (FIG. 2A) are attached to or mounted on the cold plate 200 at defined surfaces 275 or cooling mounts. The cold plate 200 in FIG. 4A is designed to accommodate 3 electronic modules on each face. The electronic modules may be attached to cold the mechanically using mechanical fasteners such as but not limited to screws that thread into holes 277 in the base 400 and cover 300 of the cold plate 200. In other examples, the electronic modules are held against the cover 300 and base 400 by mechanical clamps. In other examples, the electronic modules are bonded to the cover 300 and base 400 using epoxy or other adhesives.

The mechanical attachment may include thermal grease or a thermal pad such as a graphite pad to improve thermal contact between the electronics modules and the cover 300 and base 400. In some examples, the cooling mounts 275 may be machined to a smooth finish with a flatness better than 0.001 inch and a roughness finish better than 32-64 min Referring now to FIGS. 4A-4C, the cold plate 200 may include openings 230, 235 in both the base 400 and cover 300 through-which pass wires/cables from the electronic modules. The flow path 260 is narrowed between the arrays of extended surfaces 325, 425 to improve flow uniformity across the open passage 260. In one theory, the constriction 262 forces the flow exiting the pins 320, 420 to mix by increasing the Reynolds number of the flow. The constriction 262 accommodates the openings 230, 235 without increasing the size of the cold plate.

Figure 4B:
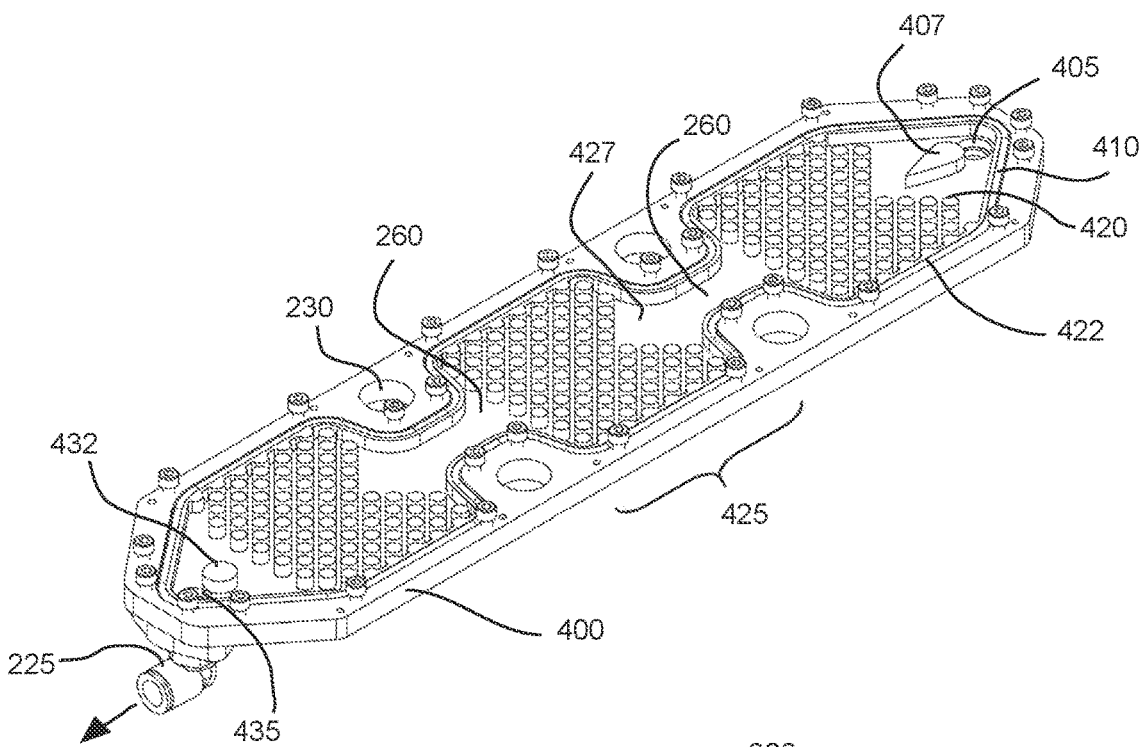
FIG. 4B is an isometric view of the cold plate cover.
Figure 4C:
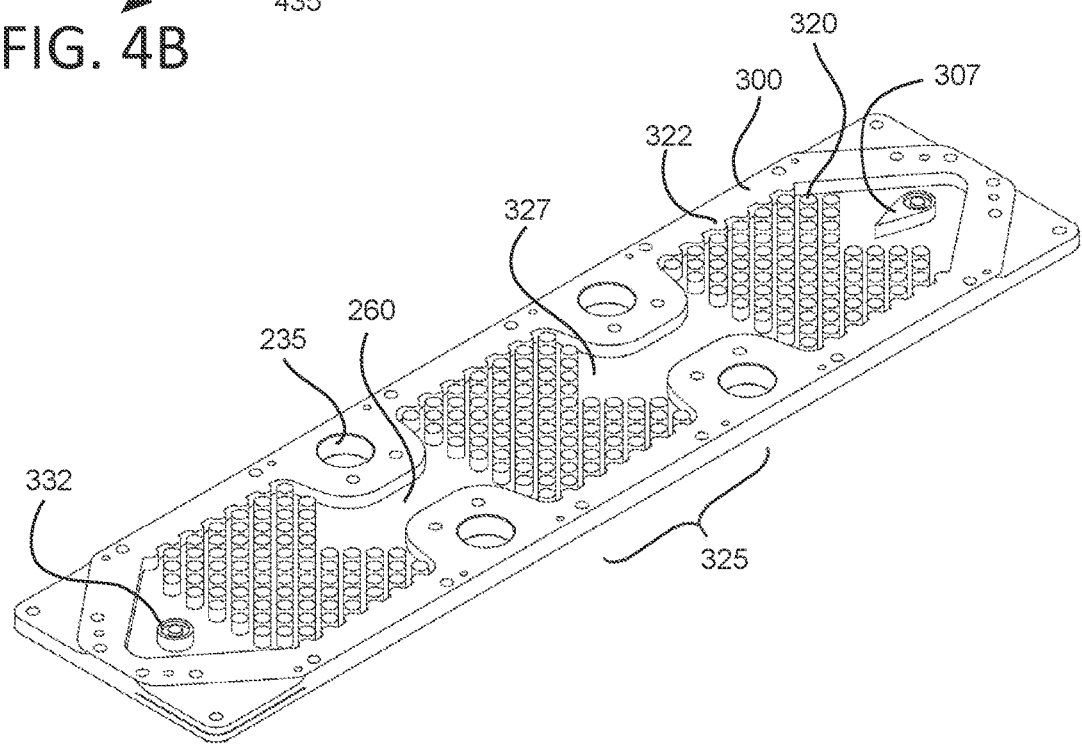
FIG. 4C is an isometric view of the cold plate base.

Continuing to refer to FIGS. 4A-4C, the cold plate 200 is a compact heat exchanger that maximizes the quality of thermal energy that can be absorbed in a given volume. The cold-plate is formed by mating two similar plates 300, 400 that provide mounting for electronic packages and cooling on their outer faces. The cooling on each outer face of the base 400, and cover 300 is assured by having extended surface arrays 325 425 on inside face. In one example, the pin arrays on each inside face are significantly similar so the pins from the base 400 and the pins from the cover 300 will align with each other. In this example, the base 400 and cover 300 could be cast or molded from the same mold and the differences between them created in a post-cast machining step. In another example, the pins 320, 420 offset with respect to one another.

FIGS. 4B and 4C present the extended surfaces on the inner faces of the base 400 and the cover 300 respectfully. In one example, the extended surfaces are pin fins in a staggered array 325, 425. In other examples, the extended surfaces may be molded straight fins, oval pins, straight fins with breaks etc. The openings between the pins 320, 420 and the open areas 260 create a flow passage between the ports 405 and 435, when the base 400 is mated to the cover 300. The arrays of pin fins 325, 425 are limited to portions of the cover 300 and base 400 that are approximately under/opposite the electronics module. The open flow passages 260 are located under portions of the cold plate without heat producing electronic modules. The pressure drop and therefore the energy requirements of the cooling system are minimized by limiting the location of extended surfaces to portions under the electronic modules or cooling mounts 275 (FIG. 4A). Conversely adding pin fins arrays in unheated portions or not under cooling mounts would only serve to increase the pressure drop of liquid coolant without significantly increasing heat transfer.

Figure 4D:
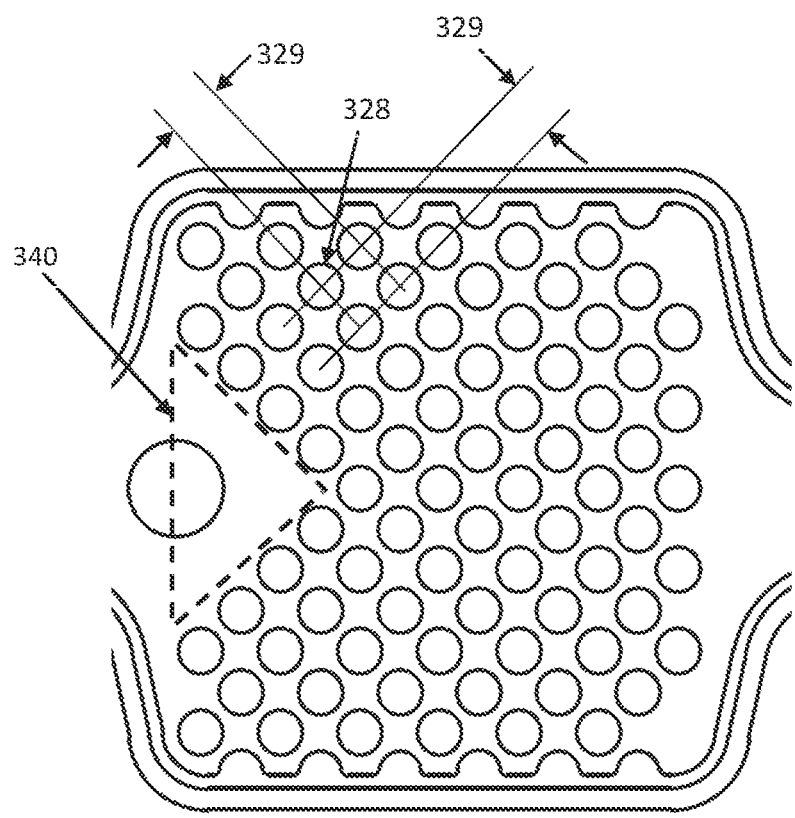
FIG. 4D is a detailed top view of the pin fins on the cold plate base.

Continuing to refer to FIGS. 4B and 4C, the pin fins may be arranged in staggered arrays 325,425. In one example, the pin fins have a height/diameter of 0.8 to 1.2. The pin fins may arranged in an equal lateral array where the spacing 329 between adjacent pin fin centerlines is equal as shown in FIG. 4D. In one example, the ratio of spacing/diameter of the pins fins is 1.25 to 1.75. In one example the pin fin diameter is approximately 5 mm. In another example the pin fin diameter is between 3 and 12 mm. The liquid flows from port 405 to port 435 and out through fitting 225. In some examples, the arrays 325,425 of extended surfaces or pin fins include an entrance region without extended surfaces or fins 327, 427. In one example, the entrance region is in the form of a wedge 327, 427. In one example the entrance region 327, 427 is a triangular region that is wide at the entrance to the array and narrows in the direction of liquid flow. In one example the entrance region 327, 427 can be described as a right-isosceles triangle. The entrance region 427 without extended surfaces or without pin fings increases the frontal area of the array 425 and encourages the liquid to flow sideways relative to the entering flow direction and engage more of the extended surfaces. The increased uniformity of flow through the array 325, 425 increases heat transfer and decreases pressure drop thereby lowering the operating temperature of the electronics module 210 and reducing the power draw of the coolant pump 530 (FIG. 3).

Continuing to refer to FIGS. 4B and 4C, the pin fins 320, 420 in the cover 300 and base 400 are designed to work together to maximize heat transfer. The pattern of pin fins is continued to the edge of the flow passage, so that in one example, a set of half pins 322, 422 occur on the walls of the second liquid passage. In one example, the arrays of pin fins 325, 425 are mirrors of one another so that when the base 400 is mounted on the cover 300, the pin fins 320, 420 approximately lineup with each other axially. This axial lineup is shown in FIG. 2B, where the pin fin 320 in the cover 300 matches up with the pin fin 420 in the base 400.

Continuing to refer to the FIGS. 4B and 4C, fairings 307, 407 332, 432 improve the uniformity of flow in the second liquid passage 260. The fairings 307, 407, 33, 432 minimize flow re-circulations that may occur without the fairings. The inlet fairings 307, 407 have a teardrop shape. The outlet fairing 332, 432 is a simple circular shape. In one example the diameters of the fairings 307, 407, 332, 432 are approximately equal to the flow ports 405, 435. The base 400 and cover 300 are joined together to create a water tight second liquid passage 260. The base 400, cover 300 may be mechanically attached with screws or other mechanical members. In one example, the flow passage 260 may be sealed with an O-ring retained in a groove 410. In another example, the base 400 and the cover 300 may attached to each other and the flow passage 260 sealed by brazing or soldering the base 400 to the cover 300. In another example, the base 400 and the cover 300 may attached to each other and the flow passage 260 sealed with adhesive between the base 400 to the cover 300.

Figure 6B:
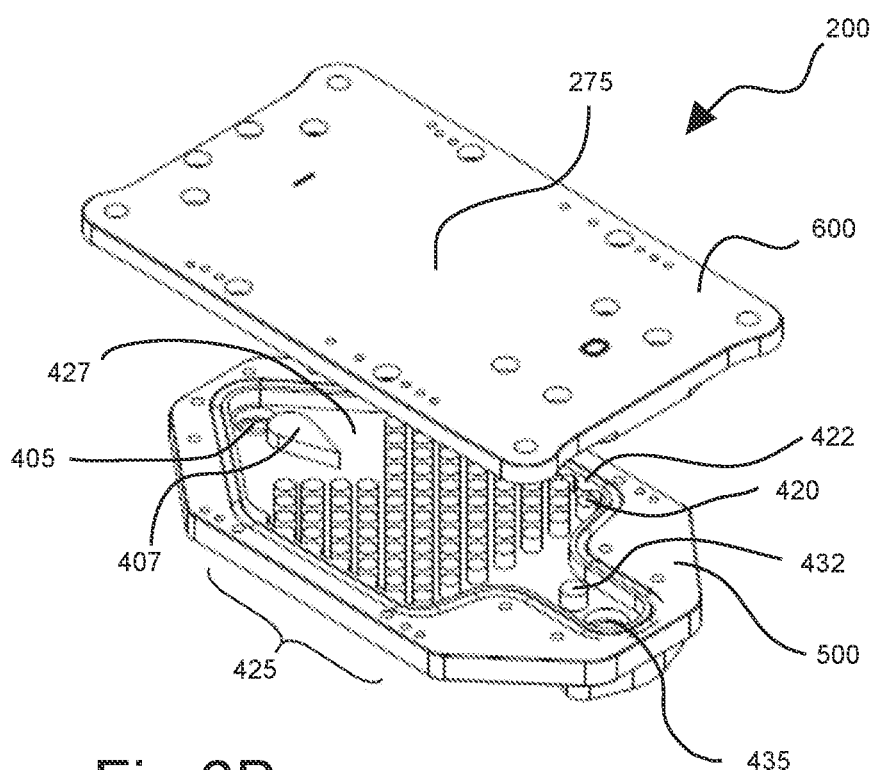
FIGS. 6A, 6B are isometric views of a cold plate with two cooling zones.
Figure 6A:
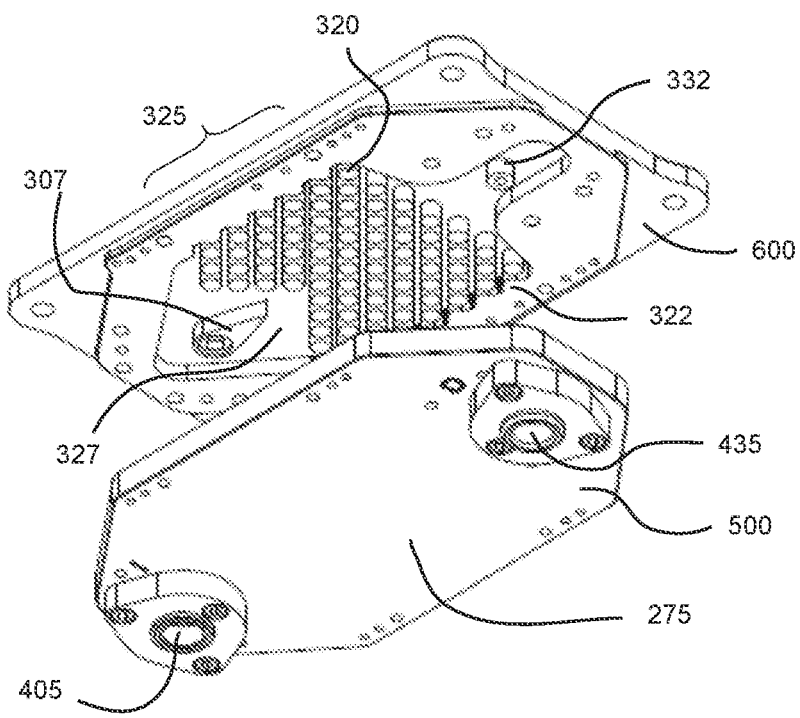

Referring now to FIGS. 6A and 6B, the cold plate 200 may comprise a cover 500 and a base 600 that each have one cooling mount 275 opposite the array of extended surfaces or pin fins 325, 425. The cover 500 and base 600 several features described in FIGS. 4B and 4C including but not limited to: staggered arrays 325, 425 of pin fins; half pin fins 322, 422 at the outer boardary of the flow passage 260; entrance sections 327, 427; inlet fairings 307, 407 upstream of the entrance sections 327, 427 and an outlet fairing 332, 432 downstream of the array.

Figure 5:
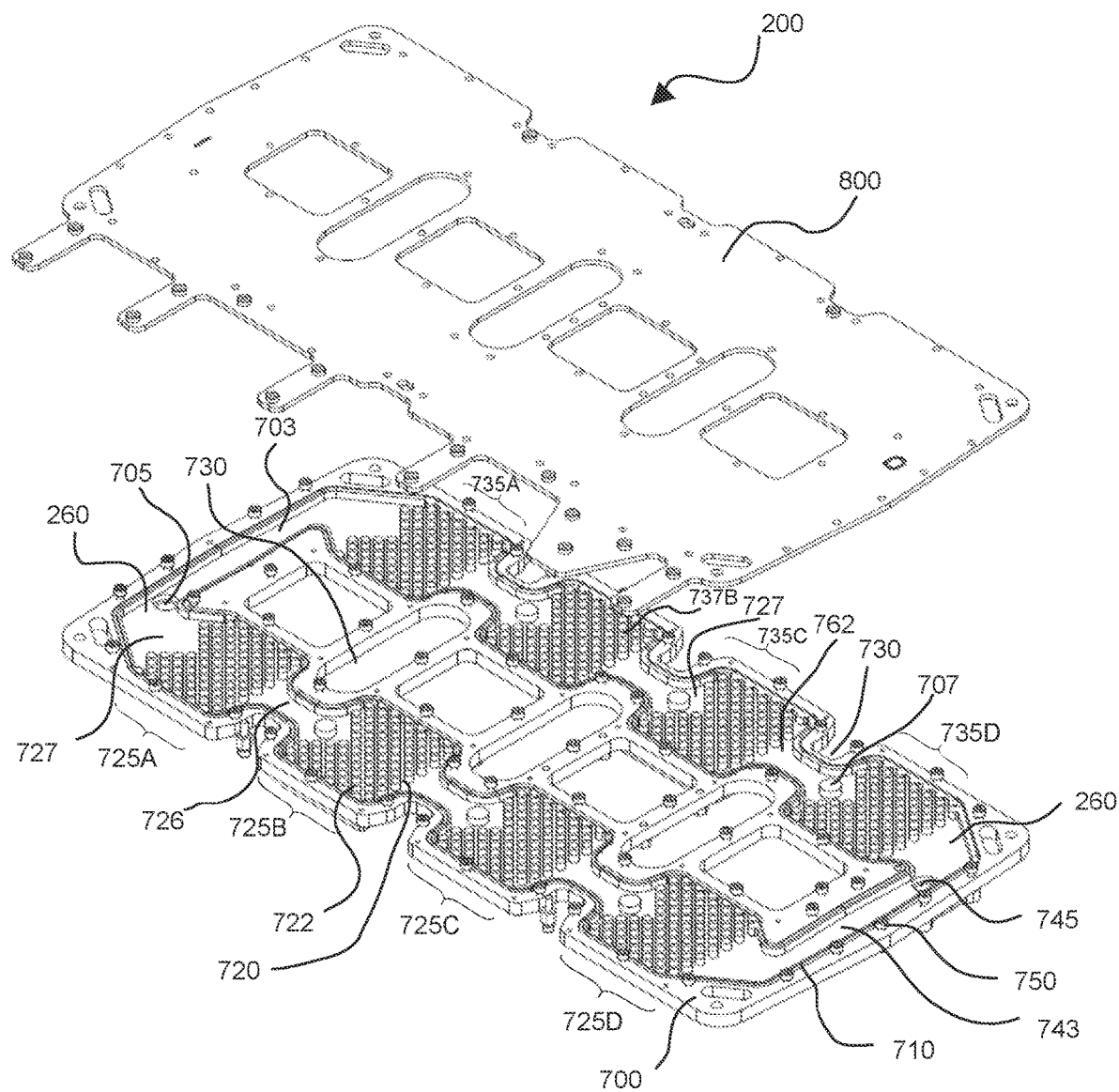
FIG. 5 is an isometric view of a cold plate base with multiple cooling zones.

Referring now to FIG. 5, multiple cooling mounts (not shown) are provided on the exterior surface of a single base plate 700. The cooling mounts are opposite to the arrays of cooling fins 725 similar to the cooling mounts 275 on base plate 400 as shown in FIGS. 4A, 4B. Cooling flow passages are created by attaching a cover plate 800 to the base plate 700. The base 700 and cover 800 may be mechanically attached with screws or other mechanical members. In one example, the flow passage 260 may be sealed with an O-ring retained in a groove 710. In another example, the base 700 and the cover 800 may attached to each other and the flow passage 260 sealed by brazing or soldering the base 700 to the cover 800. In another example, the base 700 and the cover 800 may attached to each other and the flow passage 260 sealed with adhesive between the base 700 to the cover 800.

Base plate 700 arranges the arrays into at least two parallel flow paths, where each flow path comprises one or more arrays of heat transfer fins. In FIG. 5, the coolant enters through port 705 into an inlet manifold 703. The cooling flow divides into a first stream that flows sequentially through arrays 725A-725D and a second stream that flows sequentially through arrays 735A-735D. The first and second streams recombine in the outlet manifold 743 and exit through port 745.

The flow paths 260 are narrowed between the arrays 725A-D and 735A-D to improve flow uniformity through each array. In one theory, the constriction 726 forces the flow exiting the upstream array to mix by increasing the Reynolds number of the flow before entering the downstream array. In this theory, the mixing prevents hot or cold stream of fluid forming that would reduce heat transfer in subsequent arrays. In one example, the fluid in the first stream leaving array 725A is forced to speed up and mix by the constriction 726 before entering the downstream array 725B. The constriction 762 accommodates openings 730 for wires and other items without increasing the size of the cold plate 200.

The arrays of pin fins 325, 425 are limited to portions of the base 700 that are approximately under/opposite the electronics module or cooling mounts 275. The open flow passages 260 are located under portions of the cold plate without heat producing electronic modules. The pressure drop and therefore the energy requirements of the cooling system are minimized by limiting the location of extended surfaces to portions under the electronic modules or cooling mounts 275 (FIG. 4A). Conversely, adding pin fins arrays in unheated portions or not under cooling mounts would only serve to increase the pressure drop of liquid coolant without significantly increasing heat transfer.

Continuing to refer to FIGS. 5 and 4D, the pin fins may be arranged in staggered arrays 725A-D, 735A-D. In one example, the pin fins have a height/diameter of 0.8 to 1.2. The pin fins may arranged in an equal lateral array where the spacing 329 between adjacent pin fin centerlines is equal as shown in FIG. 4D. In one example, the ratio of spacing/diameter of the pins fins is 1.25 to 1.75. In one example, the pin fin diameter is approximately 5 mm. In another example, the pin fin diameter is between 3 and 12 mm. In some examples, the arrays 725A-D, 735A-D of extended surfaces or pin fins include an entrance region without extended surfaces or fins 726. In one example, the entrance region is in the form of a wedge 727. In one example the entrance region 727 is a triangular region that is wide at the entrance to the array and narrows in the direction of liquid flow. In one example the entrance region 727 can be described as a right-isosceles triangle. The entrance region 427 without extended surfaces or without pin fings increases the frontal area of the array 425 and encourages the liquid to flow sideways relative to the entering flow direction and engage more of the extended surfaces. The increased uniformity of flow through the array 325, 425 increases heat transfer and decreases pressure drop thereby lowering the operating temperature of the electronics module 210 and reducing the power draw of the coolant pump 530 (FIG. 3).

Continuing to refer to FIG. 5, a fairing 707 may be located upstream of one or more of the arrays 725B-D, 735B-D. The upstream fairing 707 may be located partly or wholly within the entrance region 727. In one example, the upstream fairing 707 is a cylinder. In one example, the diameter of the cylinder is more twice the height of the cylinder. In one example, the axis of the fairing is located less than one pin diameter upstream of the entrance region. In one example, the diameter of the fair is 0.3 to 0.35 of the width of the entrance region. Here the upstream edge of the entrance region is defined as the upstream boundary of the pin array and downstream edges of the entrance region is defined as the outer diameters of the closes pins.

The principles of the present invention may be applied to all types of autonomous vehicles and other devices that include electronics dissipating high power. While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention.

What is claimed is:

1. A cooling system for an autonomous vehicle comprising:
   a heat exchanger including a first liquid passage and external fins;
   a fan adjacent to the heat exchanger, the fan forcing a portion of ambient air past the external fins;
   a cold plate comprising:
      a first plate with a first side configured to receive a first electronic package and a second side with a plurality of extended surfaces,
      a second plate with a third side configured to receive a second electronic package and a fourth side with a plurality of extended surfaces and two fluid ports,
      wherein the first electronic package defines a first portion of the first side and the plurality of extended surfaces being limited to a second portion of the second side surface directly opposite the first portion,
      wherein the fourth side of the second plate is mated to the second side of the first plate, thereby creating a second liquid passage between the two fluid ports, at least one of the ports is fluidicly connected to the heat exchanger; and
   a pump to move liquid through the first and second liquid passage.

2. A cooling system for an autonomous vehicle according to claim 1 wherein the plurality of extended surfaces on the second side are limited to an area aligned with the first electronic package.

3. A cooling system for an autonomous vehicle according to claim 2 wherein the extended surfaces on the fourth side of the second plate are round pins substantially aligned with the plurality of extended surface on the first plate.

4. A cooling system for an autonomous vehicle according to claim 2 wherein a plurality of round pins form a staggered array of pins.

5. A cooling system for an autonomous vehicle according to claim 1 wherein the extended surfaces on the second side of the first plate are round pins substantially perpendicular to the first surface and arranged to define flow paths between adjacent pins.

6. A cooling system for an autonomous vehicle according to claim 1 wherein the extended surfaces on the first plate are a staggered array of pin fins and the staggered array includes an entrance region for receiving liquid where the pins are further apart.

7. A cooling system for an autonomous vehicle according to claim 6 wherein the entrance region is a triangular area without pin fins.

8. A cooling system for an autonomous vehicle according to claim 6 wherein the second plate defining a third portion on the third side to receive the second electronic package and the plurality extended surfaces being limited to a forth portion of the fourth side directly opposite the third portion, the fourth portion on the second plate being aligned with first portion on the first plate.

9. A cooling system for an autonomous vehicle according to claim 6 wherein the extended surfaces on the second plate are a staggered array of pin fins and the staggered array includes an entrance region for receiving liquid where the pins are further apart.

10. A cooling system for an autonomous vehicle according to claim 1 wherein the first plate and second plate are cast in the same mold.

11. A cooling system for an autonomous vehicle according to claim 1 wherein a plurality of electronic packages are mounted to the first side of the first plate and a plurality of pin fin arrays are aligned with each electronic package.

12. A cooling system for an autonomous vehicle according to claim 11 wherein the second liquid passage in the cold plate narrows between each array of extended surfaces.

13. A cooling system for an autonomous vehicle according to claim 1 wherein the first plate and the second plate include a tear drop flow director downstream of an entrance.

14. A cooling system for an autonomous vehicle according to claim 1 wherein the first plate and the second plate include a round flow director upstream of an exit.

15. A cooling system for an autonomous vehicle according to claim 1 wherein the first plate and the second plate include a narrowed flow passage.

16. A cooling system for an autonomous vehicle according to claim 1, the cold plate further comprises an O-ring seal between the first plate and the second plate.

17. A cooling system for an autonomous vehicle comprising:
   a heat exchanger including a first liquid passage and external fins;
   a fan adjacent to the heat exchanger, the fan forcing a portion of ambient air past the external fins;
   a cold plate comprising;
   a first plate, the first plate comprising:
      a first side having a plurality of cooling mounts, each cooling mount configured to receive an electronic package, each electronics package defining a first portion of the first side; and
      a second side with two or more flow paths and a plurality of arrays of extended surfaces in the flow paths, the flow paths fluidly connected to an inlet port and an outlet port, wherein each array of extended surfaces is limited to a second portion of the second side directly opposite the first portion;
   a cover plate sealably attached to the first plate to create a second liquid passage; and
   a pump to move liquid through the first and second liquid passage.

18. A cooling system for an autonomous vehicle according to claim 17 wherein the extended surfaces are staggered round pins.

19. A cooling system for an autonomous vehicle according to claim 18 wherein the extended surfaces are a staggered array of pin fins and the staggered array includes an entrance region for receiving liquid where the pins are further apart.

20. A cooling system for an autonomous vehicle according to claim 19 wherein the entrance region is a triangular.

21. A cooling system for an autonomous vehicle according to claim 19, further comprising a fairing in the entrance region.

22. A cooling system for an autonomous vehicle according to claim 17 wherein the second liquid passage in the cold plate narrows between each array of extended surfaces.

* * * * *